(12) United States Patent
Chang et al.

(10) Patent No.: US 10,297,722 B2
(45) Date of Patent: May 21, 2019

(54) MICRO-LIGHT EMITTING DIODE WITH METAL SIDE MIRROR

(71) Applicant: Apple Inc., Cupertino, CA (US)

(72) Inventors: Kevin K. C. Chang, San Jose, CA (US); Hsin-Hua Hu, Los Altos, CA (US); Chien-Hsing Huang, Kinmen County (TW)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/542,823

(22) PCT Filed: Sep. 30, 2015

(86) PCT No.: PCT/US2015/053275
§ 371 (c)(1),
(2) Date: Jul. 11, 2017

(87) PCT Pub. No.: WO2016/122725
PCT Pub. Date: Aug. 4, 2016

(65) Prior Publication Data
US 2017/0373228 A1    Dec. 28, 2017

Related U.S. Application Data

(60) Provisional application No. 62/110,334, filed on Jan. 30, 2015.

(51) Int. Cl.
*H01L 33/46* (2010.01)
*H01L 33/44* (2010.01)
(Continued)

(52) U.S. Cl.
CPC .............. *H01L 33/46* (2013.01); *H01L 33/20* (2013.01); *H01L 33/44* (2013.01); *H04N 5/64* (2013.01);
(Continued)

(58) Field of Classification Search
CPC .......... H01L 33/44; H01L 33/46; H01L 33/40
See application file for complete search history.

(56) References Cited

U.S. PATENT DOCUMENTS 6,630,689 B2   10/2003   Bhat et al.
7,148,514 B2   12/2006   Seo et al.
(Continued)

FOREIGN PATENT DOCUMENTS

EP   2 613 370 A2   7/2013
EP   2 757 598 A2   7/2014
(Continued)

OTHER PUBLICATIONS

PCT International Search Report and Written Opinion for International Application No. PCT/US2015/053275, dated Nov. 27, 2015, 13 pages.
(Continued)

*Primary Examiner* — Allen L Parker
*Assistant Examiner* — Gustavo G Ramallo
(74) *Attorney, Agent, or Firm* — Jaffery Watson Mendonsa & Hamilton LLP

(57) ABSTRACT

Light emitting diodes and display systems are disclosed. In an embodiment a light emitting diode (150) includes a p-n diode (120) including a mesa structure (129) that protrudes from a base structure (131). A reflective metallization (130) laterally surrounds the mesa structure, which also includes a quantum well layer of the p-n diode.

14 Claims, 16 Drawing Sheets

(51) Int. Cl.
*H01L 33/20* (2010.01)
*H04N 5/64* (2006.01)
*H01L 25/075* (2006.01)

(52) U.S. Cl.
CPC ...... *H01L 25/0753* (2013.01); *H01L 2224/95* (2013.01)

(56) References Cited

U.S. PATENT DOCUMENTS

| | | |
|---|---|---|
| 7,420,218 B2 | 9/2008 | Nagai |
| 8,247,831 B2 | 8/2012 | Jagt |
| 8,809,888 B2 | 8/2014 | Kim et al. |
| 9,437,782 B2 | 9/2016 | Bower et al. |
| 2003/0143772 A1* | 7/2003 | Chen ............ H01L 33/46 438/47 |
| 2006/0204865 A1 | 9/2006 | Erchak et al. |
| 2007/0114552 A1* | 5/2007 | Jang ............ H01L 33/46 257/98 |
| 2010/0078670 A1* | 4/2010 | Kim ............ H01L 33/46 257/98 |
| 2010/0140636 A1 | 6/2010 | Donofrio et al. |
| 2010/0140752 A1 | 6/2010 | Marimuthu et al. |
| 2010/0328776 A1 | 12/2010 | Sanari et al. |
| 2011/0297914 A1 | 12/2011 | Zheng et al. |
| 2013/0126081 A1 | 5/2013 | Hu et al. |
| 2013/0126981 A1 | 5/2013 | Ho et al. |
| 2014/0267683 A1 | 9/2014 | Bibl et al. |
| 2014/0339495 A1 | 11/2014 | Bibl et al. |
| 2014/0361327 A1 | 12/2014 | Chae et al. |
| 2015/0008389 A1 | 1/2015 | Hu et al. |
| 2015/0069406 A1 | 3/2015 | Mai |

FOREIGN PATENT DOCUMENTS

| | | |
|---|---|---|
| JP | H11 340514 A | 12/1999 |
| JP | 2009 194367 A | 8/2009 |
| KR | 2014 0028803 A | 3/2014 |
| WO | WO 2007/27186 A1 | 3/2007 |
| WO | WO 2013/121051 A1 | 8/2013 |

OTHER PUBLICATIONS

Schmid, et. al, "High-Efficiency Red and Infrared Light-Emitting Diodes Using Radial Outcoupling Taper", IEEE Journal on Selected Topics in Quantum Electronics, vol. 8, No. 2, Mar./Apr. 2002, pp. 256-263.

Reto Joray, "Microcavity Light Emitting Diodes in the Visible Red and near Infrared Wavelength Range", Thesis, Ecole Polytechnique Federale de Lausanne, 2004.

* cited by examiner

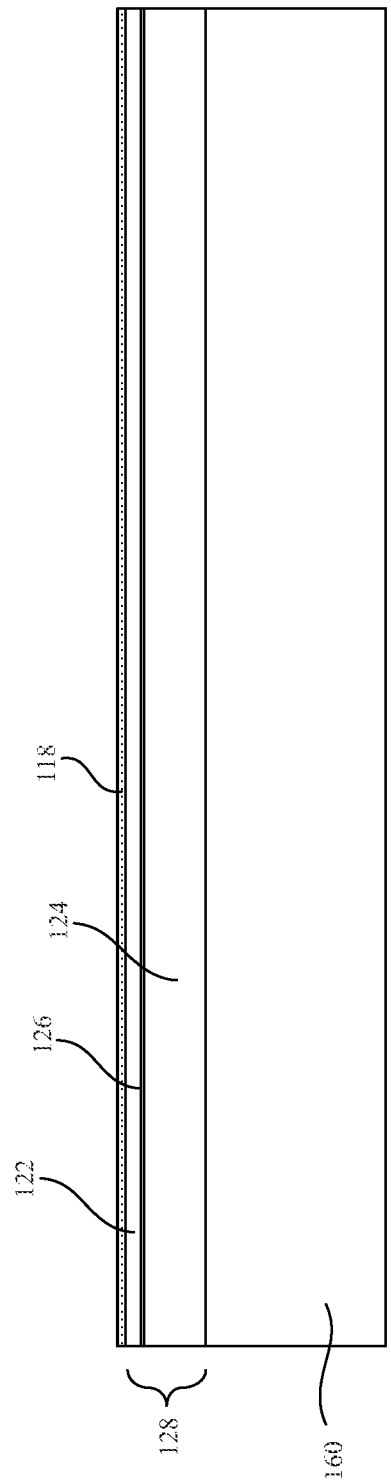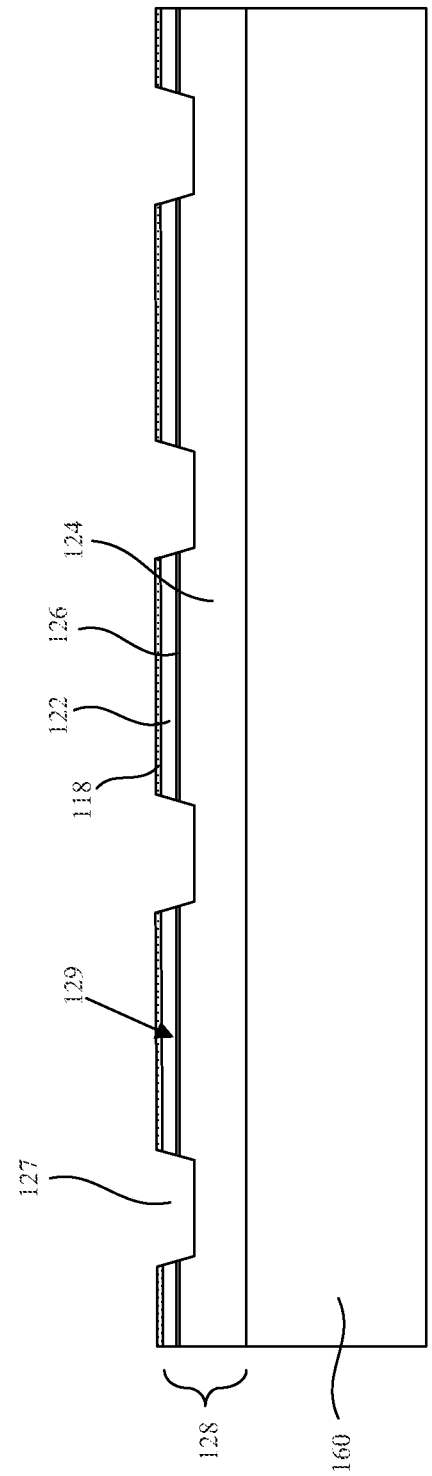

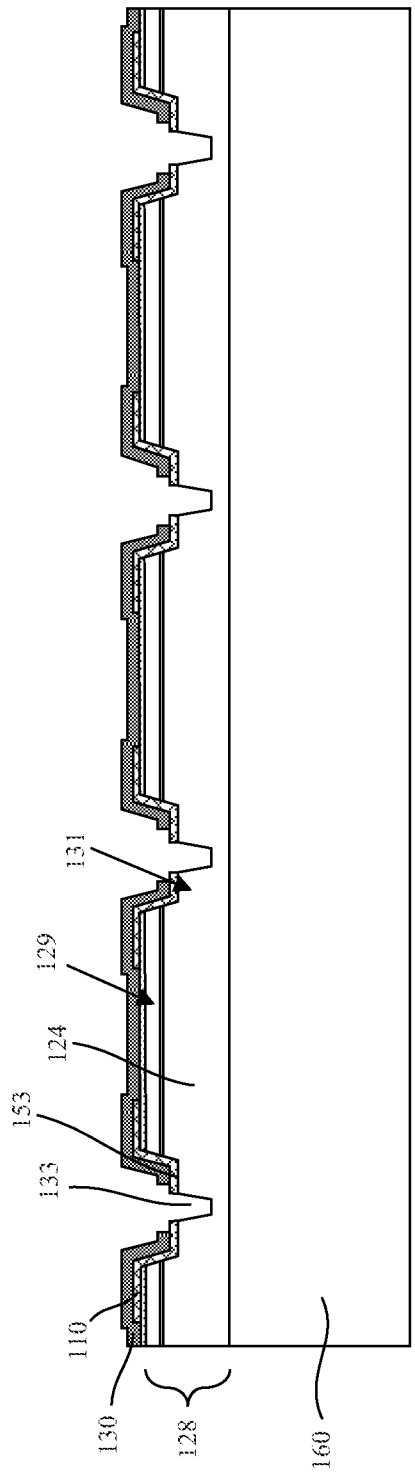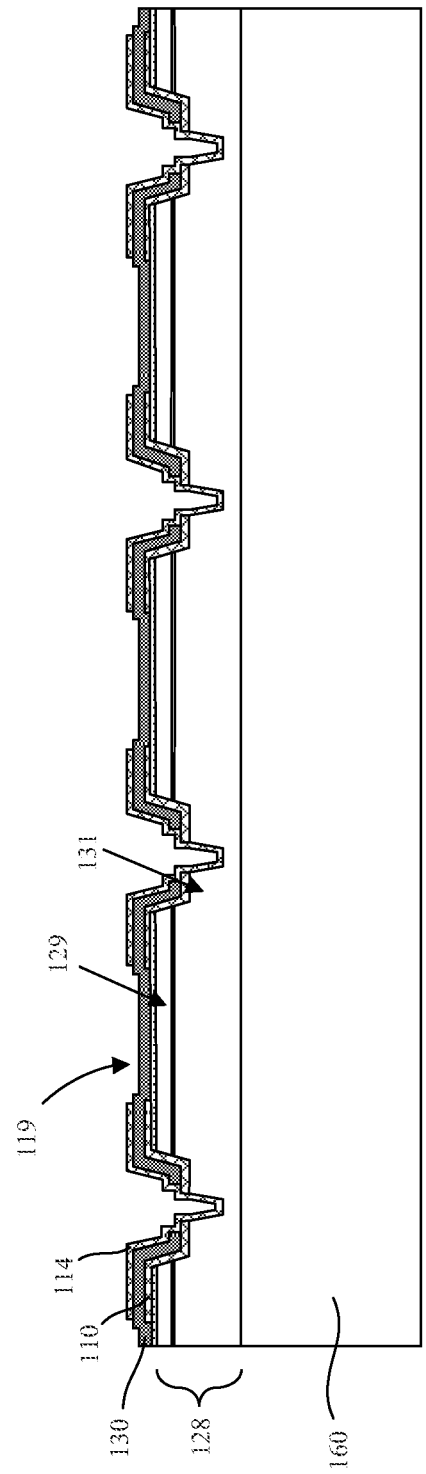

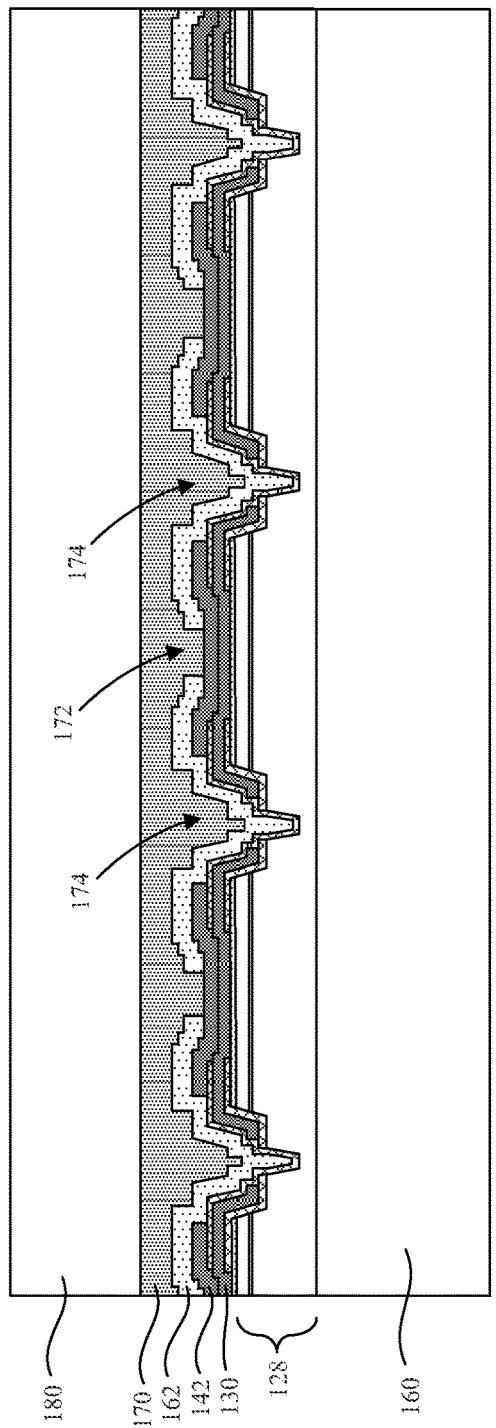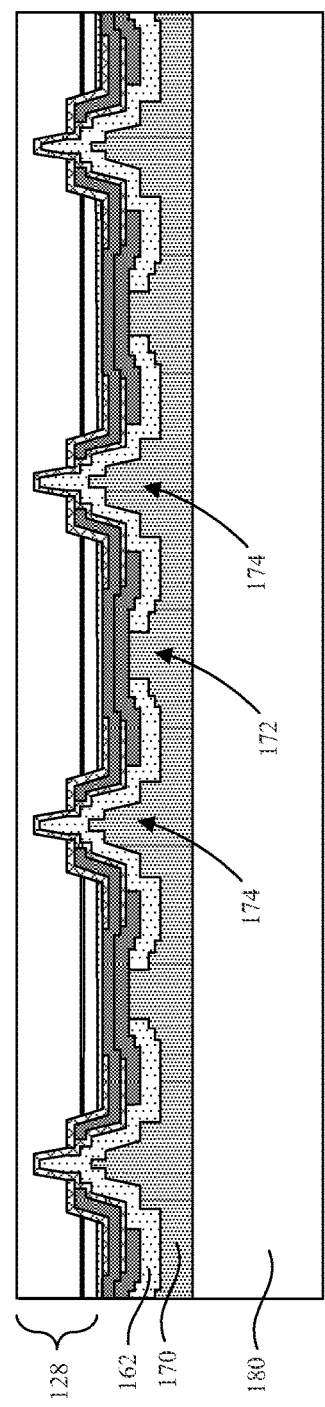

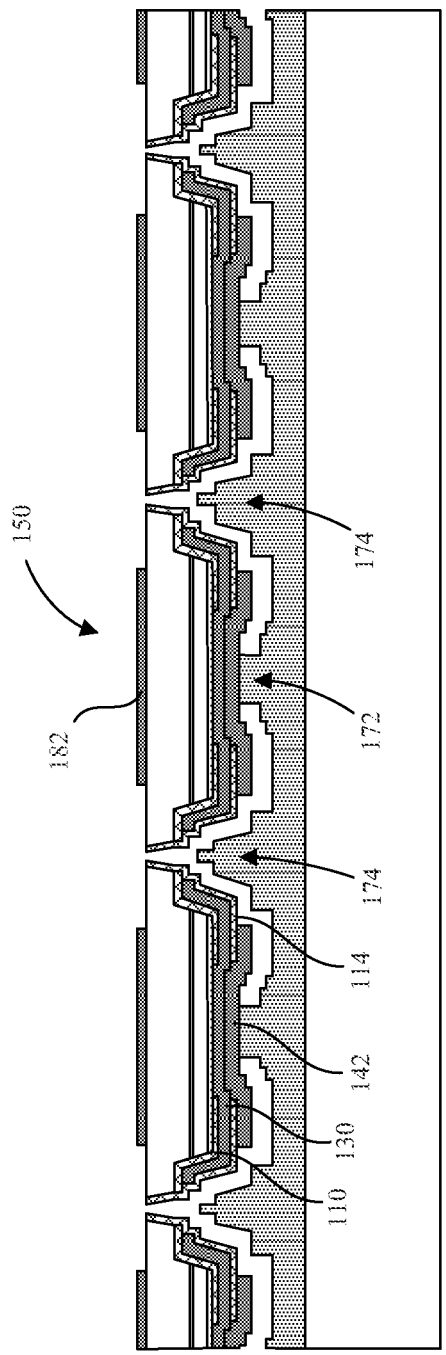
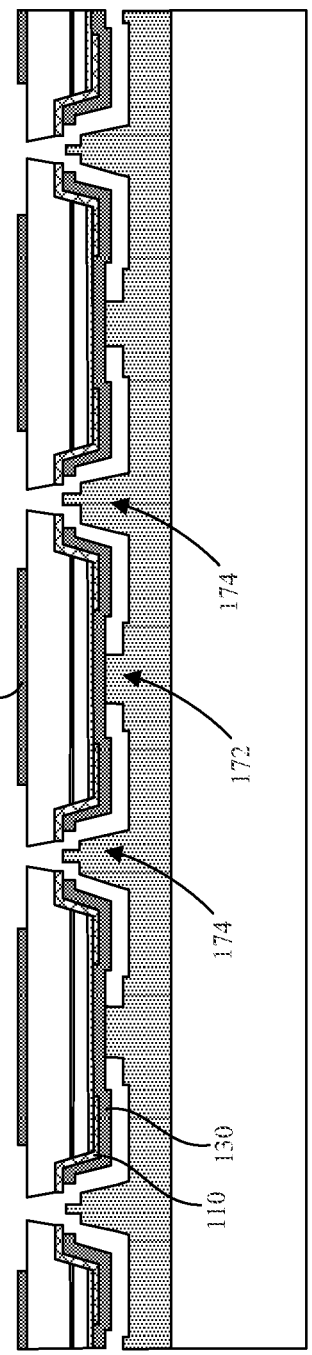

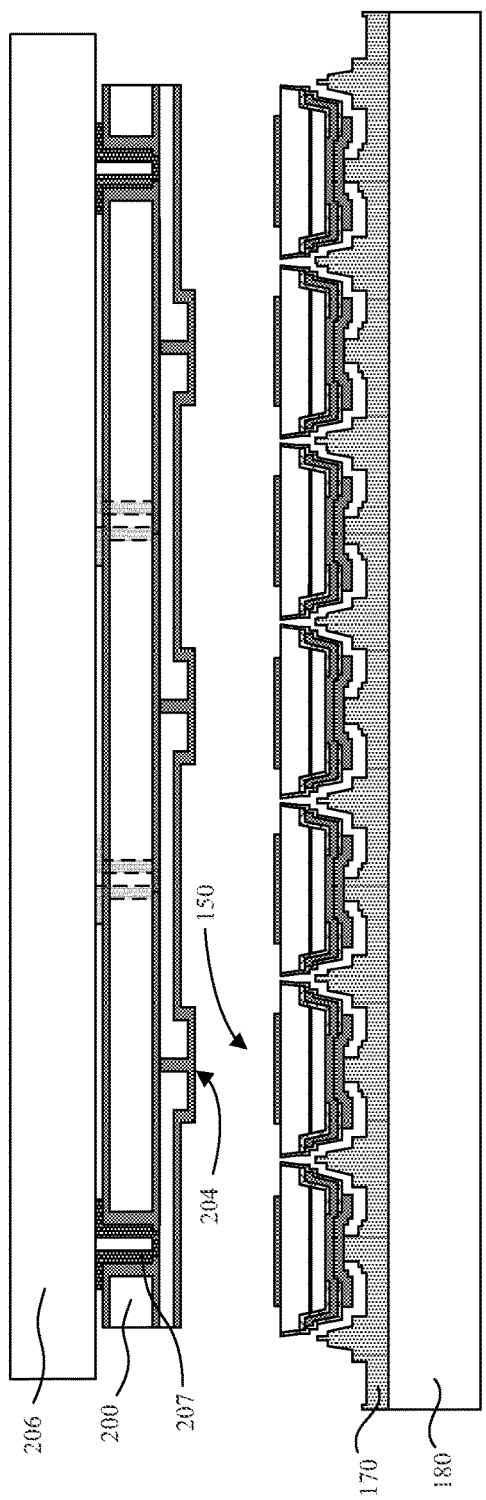
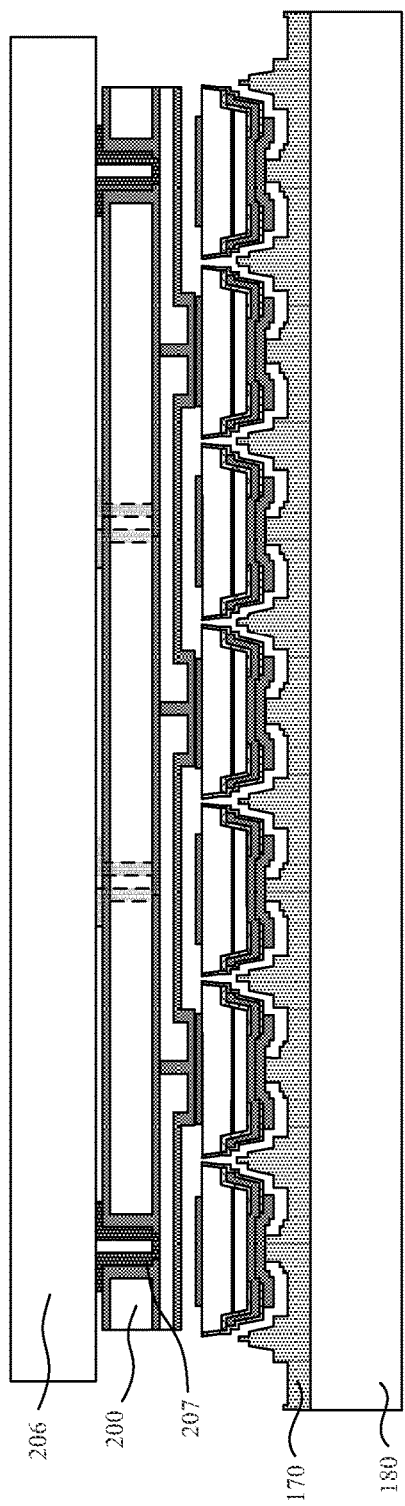
FIG. 18
FIG. 19

MICRO-LIGHT EMITTING DIODE WITH METAL SIDE MIRROR

CROSS-REFERENCE TO RELATED APPLICATIONS

This patent application is a U.S. National Phase Application under 35 U.S.C. § 371 of International Application No. PCT/US2015/053275, filed Sep. 30, 2015, entitled MICRO-LIGHT EMITTING DIODE WITH METAL SIDE MIRROR, which claims priority to U.S. Provisional Patent Application No. 62/110,334, filed on Jan. 30, 2015, which are herein incorporated by reference.

BACKGROUND

Field

Embodiments relate to light emitting diodes. More particularly embodiments relate to a light emitting diode with an integrated side mirror.

Background Information

Light emitting diodes (LEDs) are increasingly being considered as a replacement technology for existing light sources. For example, LEDs are found in signage, traffic signals, automotive tail lights, mobile electronics displays, and televisions. Various benefits of LEDs compared to traditional lighting sources may include increased efficiency, longer lifespan, variable emission spectra, and the ability to be integrated with various form factors.

One type of LED is an organic light emitting diode (OLED) in which the emissive layer of the diode is formed of an organic compound. One advantage of OLEDs is the ability to print the organic emissive layer on flexible substrates. OLEDs have been integrated into thin, flexible displays and are often used to make the displays for portable electronic devices such as mobile phones and digital cameras. When an OLED display is observed in a bright environment, reflection from the display substrate can result in deterioration of the contrast ratio. For example, ambient light may reflect off of a reflective electrode for the organic emissive layer. Accordingly, a circular polarizer is commonly located between a transparent protective cover plate and the display substrate of an electronic device to alleviate ambient light reflection. A circular polarizer may reduce brightness of the display, for example, by as much as 50%.

SUMMARY

LEDs and display systems are described. In an embodiment an LED with an integrated side mirror includes a p-n diode which includes a mesa structure protruding from a base structure. A passivation layer spans sidewalls of the mesa structure and includes an opening on a bottom surface of the mesa structure. A reflective metallization layer is on the passivation layer and within the opening in the passivation layer on the bottom surface of the mesa structure. The reflective metallization layer may laterally surround the mesa structure of the p-n diode. The p-n diode may additionally include a first layer doped with a first dopant type, a second layer doped with a second dopant type opposite the first dopant type, and a quantum well layer between the first layer and the second layer.

In an embodiment, the first layer and the quantum well layer are completely contained in the mesa structure, and the second layer is at least partially contained in the base structure. The second layer may additionally be partially contained in the mesa structure. The base structure may additionally be characterized as including a top surface and a step surface opposite the top surface, where the mesa structure protrudes from the step surface. In an embodiment, the passivation layer spans the step surface of the base structure and does not span along sidewalls of the base structure. A top conductive contact may be formed on the top surface of the base structure. In an embodiment, a conductive oxide layer is on the bottom surface of the mesa structure, where the conductive oxide layer is between the mesa structure and the reflective metallization layer.

In an embodiment, a second passivation layer is on the reflective metallization layer. For example, the second passivation layer may span sidewalls of the base structure. A second opening may be formed in the second passivation layer on the bottom surface of the mesa structure, and a second metallization layer may be on the reflective metallization layer and within the second opening of the second passivation layer.

The reflective metallization layer may include a single layer, or a layer stack. For example, the layer stack may include a minor layer and a barrier layer formed on the mirror layer. The layer stack may additionally include an outer-most bonding layer. In an embodiment, the reflective metallization layer includes a layer stack, and the second metallization layer includes a bonding layer. For example, the reflective metallization stack can include a micro layer and a barrier layer on the mirror layer. In an embodiment, the bonding layer includes a noble metal.

In an embodiment, a display system includes a plurality of LEDs bonded to a corresponding plurality of driver contacts in a display region of a display substrate. In an embodiment, a transparent protective cover plate is secured over the display region of the display substrate, and a polarizer film is not located between the transparent protective cover plate and the display substrate, and the transparent protective cover plate is exposed to ambient atmosphere. Exemplary display systems include a television, tablet, phone, laptop, computer monitor, kiosk, digital camera, handheld game console, media display, ebook display, and large area signage display.

BRIEF DESCRIPTION OF THE DRAWINGS

FIG. 4 is a cross-sectional side view illustration of a bulk LED substrate in accordance with and embodiment.

FIG. 5 is a cross-sectional side view illustration of a p-n diode layer patterned to form an array of mesa structures in accordance with an embodiment.

FIG. 8 is a cross-sectional side view illustration of the p-n diode layer patterned to form an array of base structures in accordance with an embodiment.

FIG. 9 is a cross-sectional side view illustration of a second patterned insulation layer formed over the patterned reflective metallization layer in accordance with an embodiment.

FIG. 12 is a cross-sectional side view illustration of a growth substrate bonded to a carrier substrate with a stabilization layer in accordance with an embodiment.

FIG. 13 is a cross-sectional side view illustration of a carrier substrate after removal of a growth substrate in accordance with an embodiment.

FIG. 16 is a cross-sectional side view illustration of a sacrificial release layer removed from a carrier substrate including an array of LEDs on stabilization posts in accordance with an embodiment.

FIG. 17 is a cross-sectional side view illustration of a sacrificial release layer removed from a carrier substrate including an array of LEDs on stabilization posts in accordance with an embodiment.

FIGS. 18-23 are cross-sectional side view illustrations of a method of transferring an array of LEDs from a carrier substrate to a receiving substrate in accordance with an embodiment.

DETAILED DESCRIPTION

Figure 1:
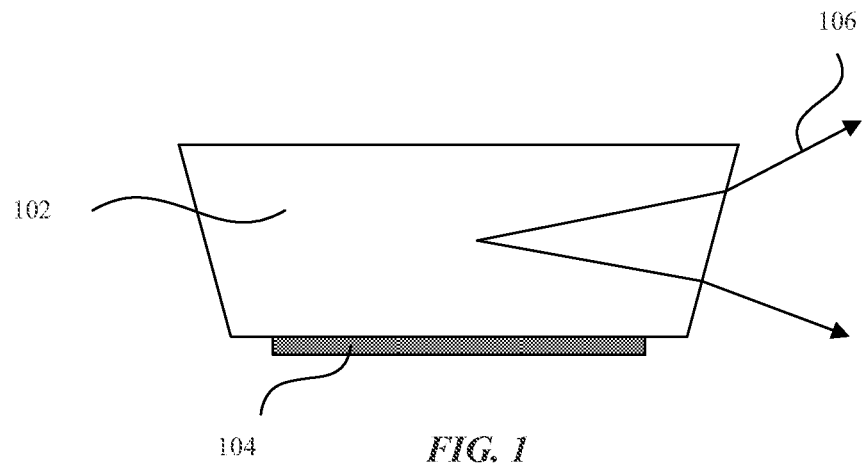
FIG. 1 is a cross-sectional side view illustration of a vertical LED.

Embodiments describe LEDs including integrated side minors, and LED integration schemes for display systems. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "spanning", "to", "between" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments describe an LED including an integrated side minor. In an embodiment, the LED includes a p-n diode in which a mesa structure protrudes from a base structure. A first layer with a first dopant type and a quantum well layer are completely contained in the mesa structure, and a second layer with a second dopant type opposite the first dopant type is at least partially contained in the base structure. The side mirror may be formed of a reflective metallization layer laterally surrounding the mesa structure of the LED. In such a configuration, light extraction efficiency may be increased by redirecting the light emitted from the sidewalls of the LEDs.

In another aspect, embodiments describe an LED including an integrated side mirror that does not span along sidewalls of the base structure. In this manner, the metallization layer(s) forming the integrated side mirror are confined away from a top surface of the LED base structure where top electrical contact is made with the LED. In accordance with such embodiments, such a configuration may protect against electrical shorting of the LED with a top electrode layer.

In another aspect, embodiments describe a display system in which a transparent protective cover plate is secured over the display region of the display substrate, and a polarizer film is not located between the transparent protective cover plate and the display substrate. In conventional display devices a polarizer film (e.g. circular polarizer) is commonly located above a display region to provide more uniform brightness or tone of light emitted from the display region. For example, a polarizer film can filter out ambient light that is reflected from reflective surfaces in the display region and improve contrast ratio. In an embodiment, each LED includes an integrated side mirror. In this manner, additional reflective surfaces can be removed from the display substrate, or otherwise reduced or covered, alleviating the reflection of ambient light.

In accordance with embodiments, the LEDs may be "micro" LEDs. As used herein the term "micro" is meant to refer to the scale of 1 to 300 µm. For example, a micro LED may have a maximum lateral (width or length) dimension of 1 to 300 µm. In an embodiment a micro LED may have a maximum lateral (width or length) dimension of 1 to 100 µm, or more specifically 1 to 10 µm.

Figure 2:
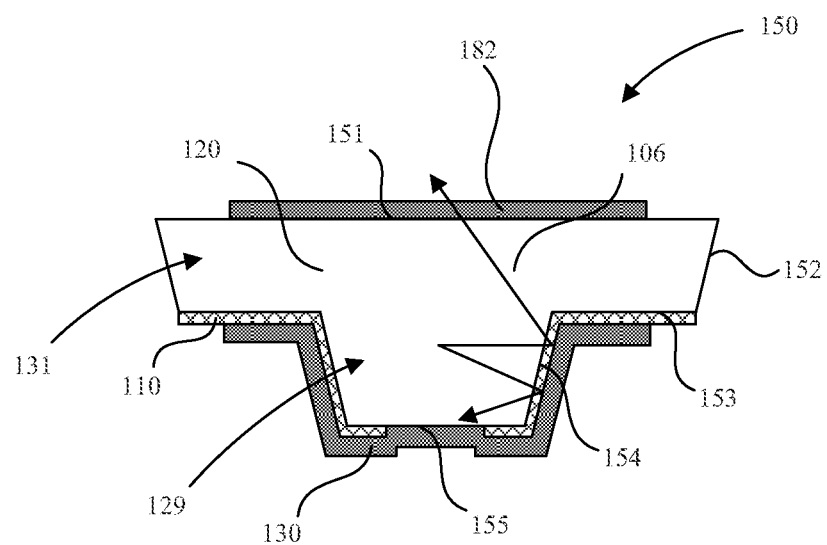
FIG. 2 is a cross-sectional side view illustration of a vertical LED including a side minor in accordance with an embodiment.

Referring to FIG. 1, a vertical LED is illustrated including a p-n diode 102 and bottom contact 104. Light 106 emitted from the LED may be directed laterally from the LED. If integrated into a display panel, additional minor structures may be needed in order to reflect the laterally emitted light out of the display. Referring now to FIG. 2, an LED 150 in accordance with an embodiment includes a p-n diode 120 and integrated side mirror. As illustrated, LED 150 is a vertical LED. Light 106 emitted laterally from the p-n diode 120 may be reflected by the reflective metallization layer 130. Where integrated into a display, the reflected light may be within a designed viewing angle such that light extraction efficiency of the display is increased.

The p-n diode 120 may be shaped to include a mesa structure 129 protruding from a step surface 153 of a base structure 131. The base structure 131 includes sidewalls 152 that are wider in both the x, y dimensions than the sidewalls 154 of the mesa structure 129 such that the mesa structure 129 protrudes from a step surface 153 on the base structure opposite a top surface 151 of the base structure. As illustrated, a mesa structure 129 may be characterized as an elevated area that may have a substantially flat elevated surface (e.g. bottom surface 155) and sidewalls 154. A base structure 131 may also be characterized as a base "mesa" structure, also with an elevated area that may have a substantially flat elevated surface (e.g. step surface 153) and sidewalls 152. Base structure 131 may also be characterized by a substantially flat base surface (e.g. top surface 151).

In the embodiment illustrated in FIG. 2, a passivation layer 110 is formed on the p-n diode 120, and spans along the step surface 153 of the base structure and sidewalls 154 of the mesa structure. The passivation layer 110 may additionally span long the bottom surface 155 of the mesa structure, and include an opening 116 that exposes the mesa structure or, for example, an ohmic contact layer on the mesa structure. In the embodiment illustrated, a reflective metallization layer 130 laterally surrounds the mesa structure 129 to form the integrated side mirror. The reflective metallization layer 130 is formed on the passivation layer 110 and within the opening 116 in the passivation layer 110 on the bottom surface 155 of the mesa structure, such that electrical contact is made with the p-n diode. As shown, the reflective metallization layer may be formed on the passivation layer 110 spanning portions of the step surface 153, sidewalls 154 of the mesa structure, and the bottom surface 155 of the mesa structure. In accordance with embodiments, the reflective metallization layer does not span along sidewalls 152 of the base structure 131.

A top conductive contact 182 may optionally be formed over the p-n diode 120, for example, on the top surface 151. In an embodiment, conductive contact 182 includes a thin metal layer or layer stack. Conductive contact 182 may also be a conductive oxide such as indium-tin-oxide (ITO), or a combination of one or more metal layers and a conductive oxide. In an embodiment, the conductive contact 182 makes ohmic contact with the p-n diode 120. Where conductive contact includes metal, the thickness may be thin for transparency and reflectivity reasons. In an embodiment where conductive contact includes a transparent material such as ITO, the conductive contact may be thicker, such as 1,000 to 2,000 angstroms.

Figure 3A:
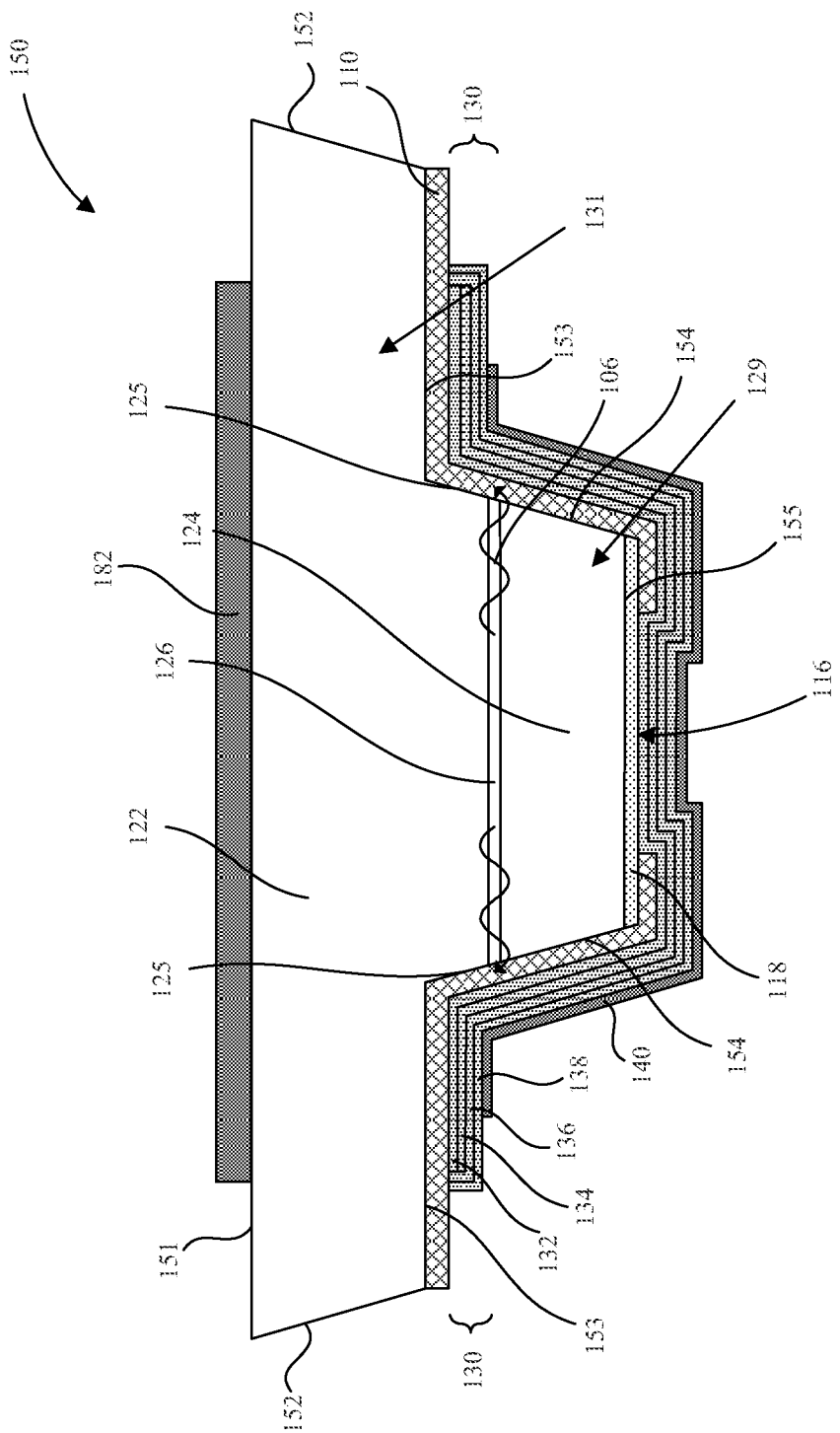
FIG. 3A is a cross-sectional side view illustration of vertical LED including a side mirror in accordance with an embodiment.

Referring now to FIG. 3A, an enlarged view of LED 150 is illustrated in accordance with an embodiment. As illustrated, the p-n diode 120 of the LED 150 includes a p-doped layer 124 (first layer doped with a first dopant type, p-dopant), an n-doped layer 122 (second layer doped with a second dopant type, n-dopant), and one or more quantum well layers 126 between the n-doped layer and the p-doped layer. In an embodiment, doping of p-doped layer 124 and n-doped layer 122 is reversed. In the embodiment illustrated, the p-doped layer 124 and quantum well layer 126 are completely contained in the mesa structure 129, and the n-doped layer 122 is partially contained in the base structure 131 and the mesa structure 129.

In the embodiment illustrated, an opening 116 is formed in the passivation layer 110 for making electrical contact with the p-n diode. The reflective metallization layer 130 may include a multiple layer stack. In an embodiment, reflective metallization layer 130 has a thickness of approximately 0.1 µm-2 µm, and may include a plurality of different layers. For example, reflective metallization layer 130 may include an adhesion layer 132 for adhesion with an ohmic contact layer 118 on the p-n diode, a mirror layer 134, an adhesion/barrier layer 136, a barrier layer 138, and a bonding layer 140. In an embodiment, adhesion layer 132 may be formed of a high work-function metal such as nickel. In an embodiment, minor layer 134 such as aluminum or silver is formed over the adhesion layer 132 to reflect the transmission of the visible wavelength. In an embodiment, titanium is used as an adhesion/barrier layer 136, and platinum is used as a barrier layer 138. The barrier layer 138 may function to protect the minor layer 134 from oxidation and/or diffusion of with the bonding layer 140, either of which could potentially reduce reflectivity of the minor layer and light extraction efficiency. In the embodiment illustrated, adhesion/barrier layer 136 and barrier layer 138 cover the top and side surfaces of the mirror layer 134. Bonding layer 140 may be formed of a variety of materials which can be chosen for bonding to the receiving substrate. In an embodiment, bonding layer 140 is formed of a conductive material (both pure metals and alloys) into which a solder material (e.g. indium, bismuth, tin) on a receiving substrate can diffuse. In an embodiment, bonding layer 140 is formed of a noble metal, such as gold or silver.

Still referring to FIG. 3A, it is to be appreciated that the relative thicknesses of the layers 110, 130 are not necessarily drawn to scale. In an embodiment, the passivation layer 110 is formed of an electrically insulating material and need be only so thick to prevent electrical shorting between doped layers 122, 124. Passivation layer 110 may be formed of an oxide material, such as $Al_2O_3$, and may be formed using a suitable technique such as atomic layer deposition. In an embodiment, passivation layer 110 is 250-1,000 angstroms thick, or more specifically 300-500 angstroms thick. Adhesion layer 132 may be thick enough for adhesion purposes. For example, adhesion layer 132 may be 20 angstroms thick nickel. In an embodiment, layers 134, 136, 138, 140 are each 250 angstroms thick or higher. In the embodiment illustrated, adhesion/barrier layer 136 and diffusion barrier 138 are formed over, and laterally surround the mirror layer 134. The reflective metallization layer 130 may have a suitable thickness such as 0.1-2 µm. While a specific layer stack is illustrated in FIG. 3A for the reflective metallization layer 130, it is understood that the particular arrangement is exemplary, and that embodiments are not limited to the specific layers.

Figure 3B:
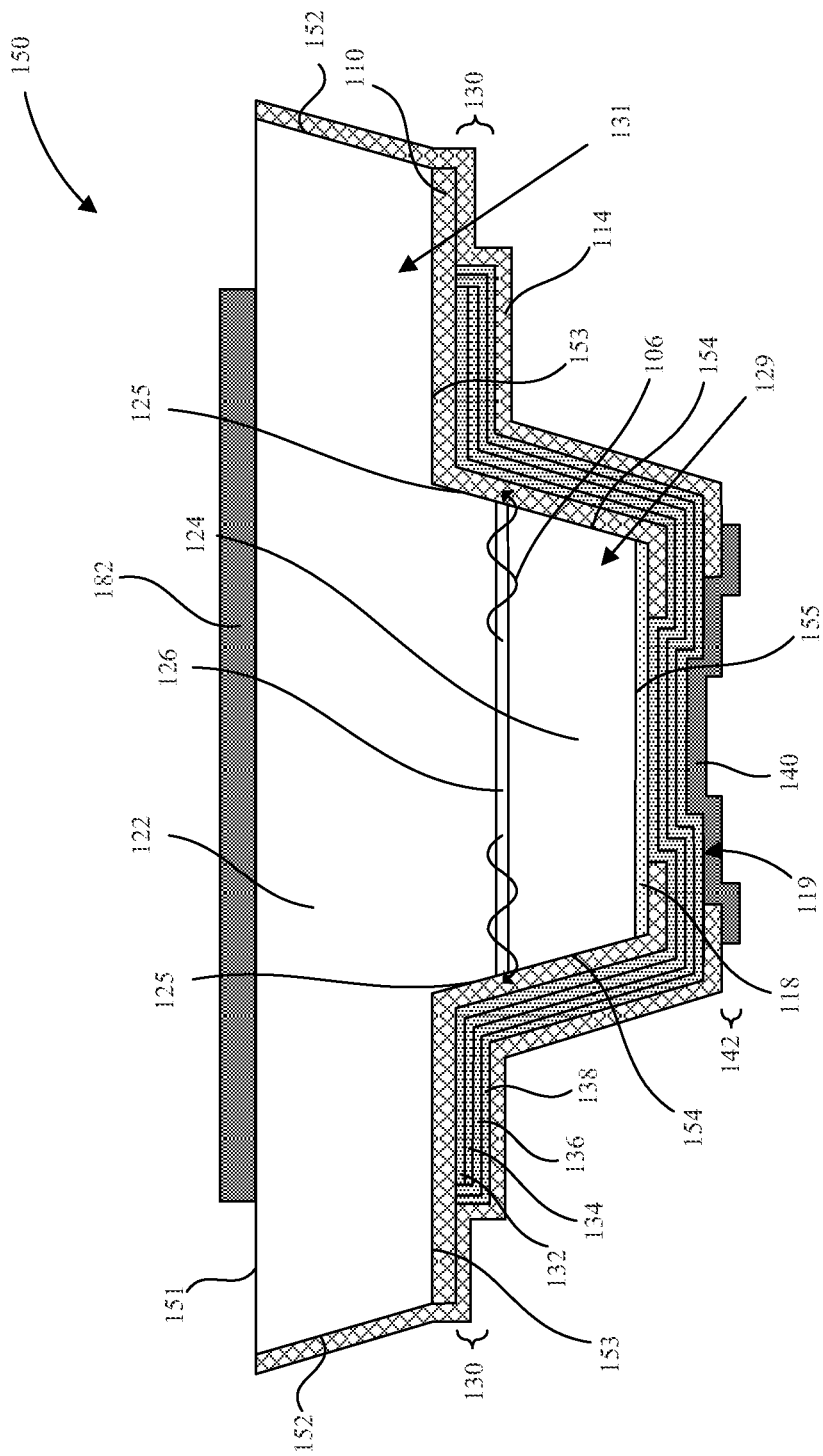
FIG. 3B is a cross-sectional side view illustration of vertical LED including a passivated side mirror in accordance with an embodiment.

Referring now to FIG. 3B, an enlarged view of LED 150 is illustrated in accordance with an embodiment. The LED illustrated in FIG. 3B is similar to that described and illustrated in FIG. 3A, with an additional second passivation layer 114 and second metallization layer 142. As shown, the second passivation layer 114 is on the reflective metallization layer 130, and additionally spans sidewalls 152 of the base structure 131. In this configuration, the reflective metallization layer 130 is fully passivated, other than where electrical contact is made through a second opening 119 in the second passivation layer 114 on the bottom surface of the mesa structure. The second opening 119 may be wider than the opening 116 formed in the first passivation layer 110 so that it still surrounds the first opening if there is a shift in alignment of the patterning tools utilized during fabrication. A second metallization 142 may be formed on the reflective metallization layer 130 and within the second opening 119 in the second passivation layer 114.

The reflective metallization layer 130 and second metallization layer 142 may each be formed of one or more layers. In the embodiment illustrated in FIG. 3B, the reflective metallization layer 130 is similar to the one described above with regard to FIG. 3A without the bonding layer 140. In the embodiment illustrated in FIG. 3B, the bonding layer 140 forms the second metallization layer 142. Though the second metallization layer 142 may include one or more additional layers.

FIG. 4 is a cross-sectional side view illustration of a bulk LED substrate in accordance with an embodiment. In the illustrated embodiment, bulk LED substrate includes a growth substrate 160 and a p-n diode layer 128. The bulk LED substrate illustrated in FIG. 4 may be designed for emission of primary red light (e.g. 620-750 nm wavelength), primary green light (e.g. 495-570 nm wavelength), or primary blue light (e.g. 450-495 nm wavelength), though embodiments are not limited to these exemplary emission spectra. The p-n diode layer 128 may be formed of a variety of compound semiconductors having a band gap corresponding to a specific region in the spectrum. For example, the p-n diode layer 128 can include one or more layers based on II-VI materials (e.g. ZnSe) or III-V materials including III-V nitride materials (e.g. GaN, AlN, InN, InGaN, and their alloys) and III-V phosphide materials (e.g. GaP, AlGaInP, and their alloys). The growth substrate 160 may include any suitable substrate such as, but not limited to, silicon, SiC, GaAs, GaN, and sapphire.

In an embodiment, growth substrate 160 is sapphire and may be approximately 500 μm thick. Using a sapphire growth substrate may correspond with manufacturing blue emitting LEDs (e.g. 450-495 nm wavelength) or green emitting LEDs (e.g. 495-570 nm wavelength). In the illustrated embodiment, p-n diode layer 128 includes one or more quantum well layers 126 between doped semiconductor layer 122 (e.g. n-doped) and doped semiconductor layer 124 (e.g. p-doped), although the doping of layers 122, 124 may be reversed. In an embodiment, doped semiconductor layer 122 is formed of GaN and is approximately 0.1 μm to 3 μm thick. The one or more quantum well layers 126 may have a thickness of approximately 0.5 μm. In an embodiment, doped semiconductor layer 124 is formed of GaN, and is approximately 0.1 μm to 2 μm thick. While the specific embodiments described an illustrated are made with regard to a p-n diode layer 128 including top and bottom doped layers, and a quantum well layer, additional layers may be included including cladding layers, barrier layers, layers for ohmic contact etc., as well as buffer layers for aiding in epitaxial growth and etch stop layers. Accordingly, a three layer p-n diode layer 128 is to be understood as illustrative and not limiting. In the particular embodiment illustrated in FIG. 4, an ohmic contact layer 118 is formed over the p-n diode layer 128 to make ohmic contact. For example, the ohmic contact layer may be a conductive oxide, such as indium-tin-oxide (ITO) with a thickness of 500-1,000 angstroms.

It is also to be appreciated, that while the specific embodiments illustrated and described in the following description may be directed to formation of green or blue emitting LEDs, the following sequences and descriptions are also applicable to the formation of LEDs that emit wavelengths other than blue and green. For example, the bulk LED substrate may correspond to red emitting LEDs. For example, growth substrate 160 may be formed of GaAs, and p-n diode layer 128 includes a doped semiconductor layer 122 (e.g. n-doped) formed of AlGaInP and a doped semiconductor layer 124 (e.g. p-doped) formed of GaP.

Referring now to FIG. 5 trenches 127 are etched into the p-n diode layer 128 to form an array of mesa structures 129 over growth substrate 160 in accordance with an embodiment. Etching of the ohmic contact layer 118 and layers 122, 124, 126 of p-n diode layer 128 may be accomplished using suitable etch chemistries for the particular materials. For example, layers 122, 124, 126 may be dry etched in one operation with a $BCl_3$ and $Cl_2$ chemistry. As described above, the illustration of layers 122, 124, 126 is a simplified p-n diode structure and additional layers may be present within the layers, which may possibly require separate etching chemistries or techniques. As FIG. 5 illustrates, p-n diode layer 128 may not be etched completely through which leaves unremoved portions of p-n diode layer 128 that connect the mesa structures 129. In one example, the etching of p-n diode layer 128 is stopped in n-doped semiconductor layer 124 (or in a buffer layer for epitaxial growth of the p-n diode layer, or on an etch stop layer within the illustrated layer 124). In this manner, the trenches 127 are etched through the quantum well layer(s) 126 so that a sidewall minor can be subsequently formed laterally adjacent to, and surrounding the quantum well layer(s).

Figure 6:
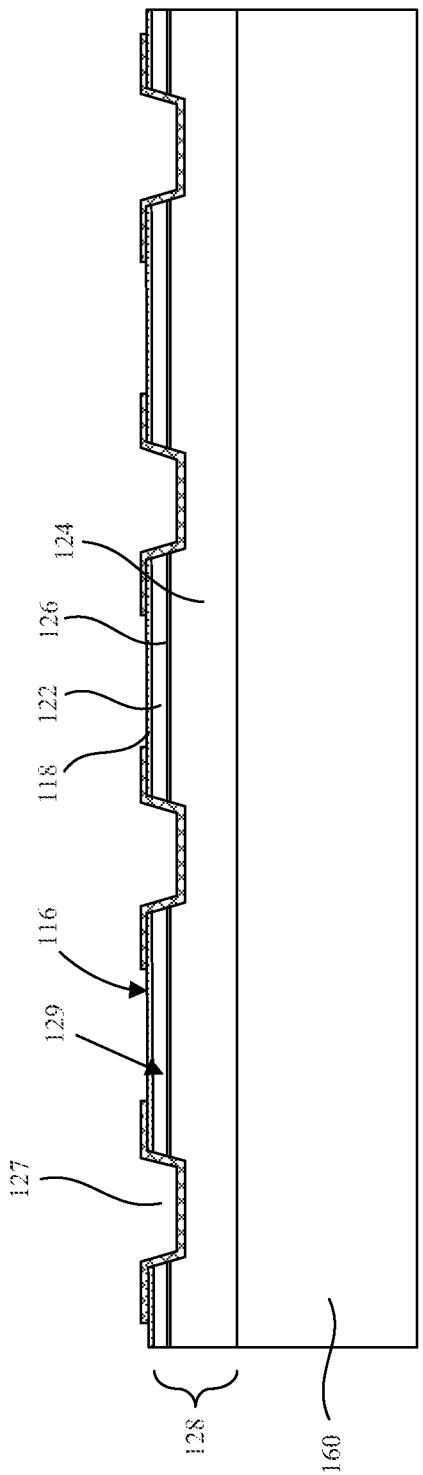
FIG. 6 is a cross-sectional side view illustration of a patterned passivation layer formed over a patterned p-n diode layer in accordance with an embodiment.

Following the formation of mesa structures 129, a passivation layer 110 is formed over the patterned p-n diode layer 128 and patterned to form openings 116 over the mesa structures 129 as shown in FIG. 6. Passivation layer 110 may be formed of an oxide material, such as $Al_2O_3$, and may be formed using a suitable technique such as atomic layer deposition (ALD). ALD may allow for uniform deposition thickness on the topography, as well as controlled uniformity across the wafer. Thus, ALD is useful for obtaining controlled thickness uniformity within the wafer and from wafer to wafer. In an embodiment, passivation layer 110 is 250-1,000 angstroms thick, or more specifically 300-500 angstroms thick. The openings 126 may be narrower than the bottom surfaces 155 of the corresponding mesa structures 129.

Figure 7:
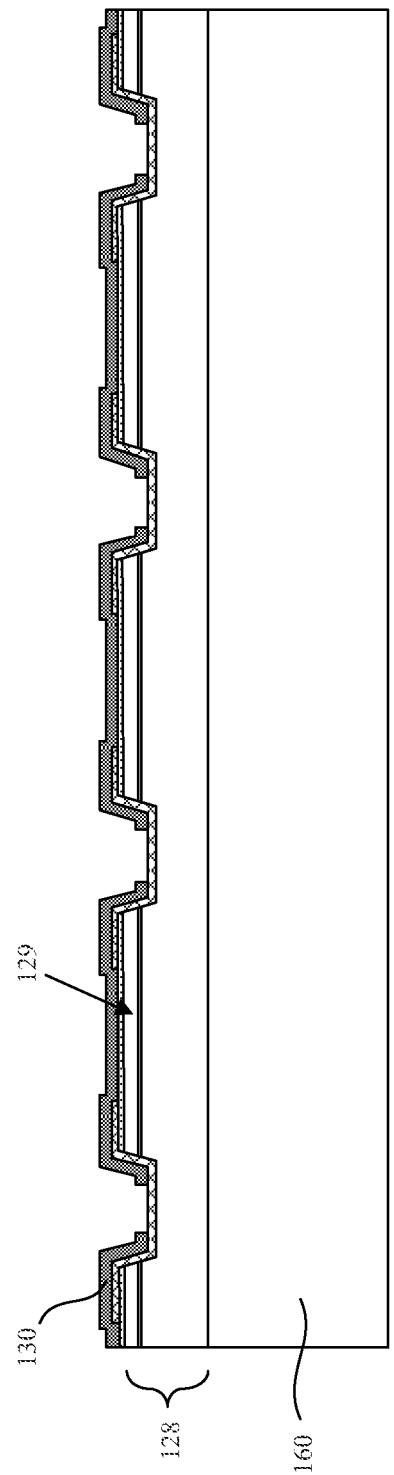
FIG. 7 is a cross-sectional side view illustration of a patterned reflective metallization layer deposited over the patterned passivation layer in accordance with an embodiment.

A patterned reflective metallization layer 130 is then deposited over the array of mesa structures 129 and patterned passivation layer 110, and within the openings 116 in the passivation layer 110 on the bottom surface of the mesa structures 129 as illustrated in FIG. 7. In an embodiment where an ohmic contact layer 118 is present, the reflective metallization layer 130 may be formed directly on the ohmic contact layer 118. In the particular embodiment illustrated the reflective metallization layer is patterned to form separate reflective metallization layers 130 around each mesa structure 129. Alternatively, each separate reflective metallization layer 130 may surround a plurality of mesa structures 129.

The reflective metallization layer 130 may include a layer stack as described above with regard to FIGS. 3A-3B. A variety of deposition techniques may be used such as sputtering or evaporation. Patterning may be accomplished with etching or a lift-off technique. The particular technique may be selected in order to achieve suitable step coverage with the topography of the mesa structures 129 and passivation layer 110. For example, as described above, passivation layer 110 may be formed using a technique such as ALD to achieve a conformal, quality passivation layer, which allows the subsequent deposition of a uniform, quality reflective metallization layer 130. In the embodiment illustrated in FIG. 7, each separate reflective metallization layer 130 laterally surrounds a corresponding mesa structure 129, and more specifically, laterally surrounds the quantum well layer(s) 126. In an embodiment in which each separate reflective metallization layer 130 includes a multiple layer stack including a mirror layer 134 (e.g. aluminum or silver) the mirror layer 134 spans across layers 122, 126, 124 such that the mirror layer 134 laterally surrounds the quantum well layers(s) 126 to reflect emitted light within a designed viewing angle.

Referring now to FIG. 8, trenches 133 are etched further through the doped layer 124 of the p-n diode layer 128 to form base structures 131 in accordance with an embodiment. In the particular embodiment illustrated, trenches 133 are formed around each mesa structure 129, such that each mesa structure 129 has a corresponding base structure 131. In other embodiments, each base structure 131 may include a plurality of mesa structures 129. The trenches 133 may be formed completely through or partially through the doped layer 124. Furthermore, the trenches 133 may be etched into a buffer layer, which may be doped or undoped, that resides between the growth substrate 160 and the doped layer 124. Etching may be performed utilizing suitable etching techniques, such as those described above for etching of trenches 127 into the p-n diode layer 128.

In the following description made with regard to FIGS. 9-10 additional passivation and metallization structures may be optionally formed. For example, these optional processing sequences may be performed to form the LED structures illustrated and described with regard to FIGS. 3B and 16. The optional processing sequences may be omitted to form the LED structures illustrated and described with regard to FIGS. 3A and 17. Accordingly, the processing sequences are intended to be exemplary for various structures methods and of forming LEDs with integrated side mirrors, as well as side minor passivation techniques.

Referring now to FIG. 9, a second passivation layer is formed over the patterned p-n diode layer 128 and reflective metallization layer 130, and patterned to form openings 119 over the mesa structures 129. Second passivation layer 114 may be formed similarly as passivation layer 110. For example, second passivation layer 114 may be formed of an oxide material, such as $Al_2O_3$, and may be formed using a suitable technique such as atomic layer deposition. In an embodiment, second passivation layer 114 is 250-1,000 angstroms thick, or more specifically 300-500 angstroms thick. The openings 129 may be wider than the openings 116 in the passivation layer 110 for alignment purposes. As shown, the second passivation layer 114 is conformal to the underlying topography. The second passivation layer encapsulates the reflective metallization layer 130, other than where the reflective metallization layer is exposed at openings 119. The second passivation layer 114 is also formed along the sidewalls 152 of the base structures 131. In such a configuration, the second passivation layer 114 provides electrical insulation to both the reflective metallization layer, and sidewalls 152 of the p-n diode at the base structure 131. For example, the additional electrical insulation may be useful to prevent electrical shorting that could potentially result as a consequence of forming a top electrode layer 330 over one or more LEDs (see FIG. 24). The second passivation layer 114 additionally provides chemical protection to the reflective metallization layer 130, for example, during etching of the sacrificial release layer 162 to release the LEDs (see FIGS. 15-17) so that they are poised for pick up and transfer from the carrier substrate to a receiving substrate. For example, second passivation layer 114 may provide chemical protection to the mirror layer 134 in addition to, or in alternative to the adhesion/barrier layers 136, 138.

Figure 10:
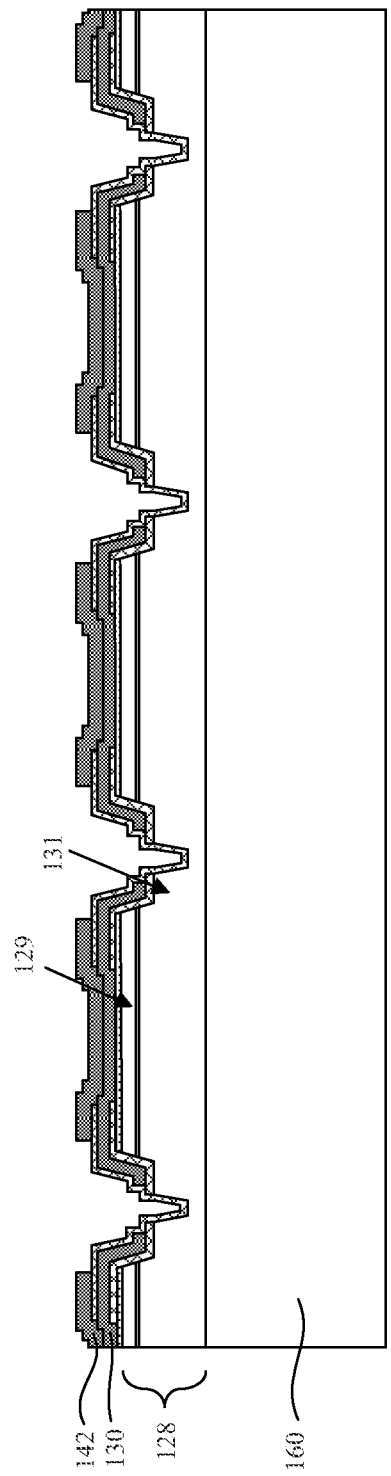
FIG. 10 is a cross-sectional side view illustration of a second metallization layer deposited over the second patterned insulation layer in accordance with an embodiment.

In an embodiment, an array of second metallization layers 142 are formed on the reflective metallization layer 130 and within the second openings 119 of the second passivation layer 114 as illustrated in FIG. 10 using suitable techniques such as sputtering or electron beam physical deposition followed by etching or liftoff. The second metallization layer 142 may include a single layer or layer stack as described above with regard to FIG. 3B. In an embodiment, the second metallization layer 142 is the bonding layer 140.

Figure 11:
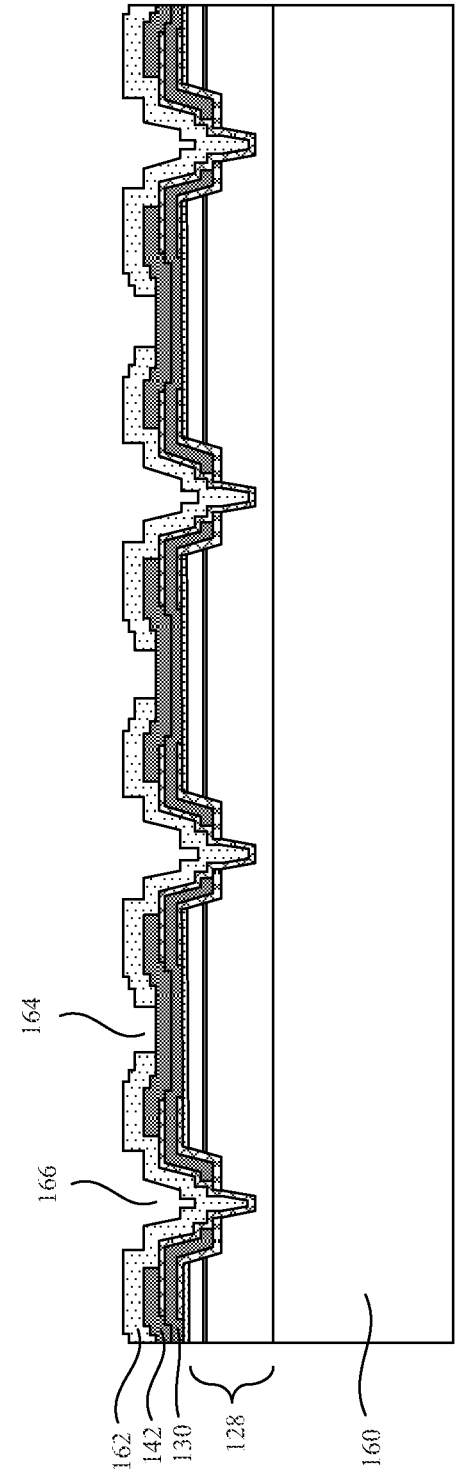
FIG. 11 is a cross-sectional side view illustration of a patterned sacrificial release layer in accordance with an embodiment.

FIG. 11 is a cross-sectional side view illustration of a sacrificial release layer 162 including an array of openings 164 formed over the patterned p-n diode layer 128 in accordance with an embodiment. In an embodiment, sacrificial release layer 162 is between approximately 0.5 and 2 microns thick. In an embodiment, sacrificial release layer 162 is formed of an oxide (e.g. $SiO_2$) or nitride (e.g. $SiN_x$), though other materials may be used which can be selectively removed with respect to the other layers. In an embodiment, sacrificial release layer 162 is deposited by sputtering, low temperature plasma enhanced chemical vapor deposition (PECVD), or electron beam evaporation to create a low quality layer, which may be more easily removed than a higher quality layer deposited by other methods such as atomic layer deposition (ALD) or high temperature PECVD. After forming sacrificial release layer 162, the sacrificial release layer 162 is patterned to form an array of openings 164 over the array of reflective metallization layers 130, or second metallization layers 142 if present. In an example embodiment, a fluorinated chemistry (e.g. HF vapor, or $CF_4$ or $SF_6$ plasma) is used to etch the $SiO_2$ or $SiN_x$ sacrificial release layer 162.

As will become more apparent in the following description the height, and length and width of the openings 164 in the sacrificial layer 162 correspond to the height, and length and width (area) of the stabilization posts to be formed, and resultantly the adhesion strength that must be overcome to pick up the array of LEDs that are poised for pick up on the array of stabilization posts. In an embodiment, openings 164 are formed using lithographic techniques and have a length and width of approximately 1 μm by 1 μm, though the openings may be larger or smaller so long as the openings have a width (or area) that is less than the width (or area) of the of reflective metallization layers 130, or second metallization layers 142, if present, and/or micro LEDs. Furthermore, the height, length and width of the openings 166 between the sacrificial release layer 162 formed along sidewalls 152, 154 of the LEDs will correspond to the height, length and width of the stabilization cavity sidewalls to be formed. Accordingly, increasing the thickness of the sacrificial release layer 162 and or decreasing the space separating adjacent base structures 131 may have the effect of decreasing the size of the stabilization cavity sidewalls.

Referring to FIG. 12, in an embodiment a stabilization layer 170 is formed over the sacrificial release layer 162. The portion of the stabilization layer 170 within openings 164 becomes the stabilization posts 172, and the portion of the stabilization layer 170 within the openings 166 becomes the stabilization structure sidewalls 174. In an embodiment, the stabilization layer 170 is formed of a thermoset material such as benzocyclobutene (BCB). Bonding of the carrier substrate 180 to the growth substrate 160 may include irreversibly curing (cross-linking) of the thermoset material.

In an embodiment the stabilization layer 170 may be formed from a spin-on electrical insulator material. In such an embodiment, planarization and bonding can be accomplished in the same operation without requiring additional processing such as grinding or polishing.

Figure 14:
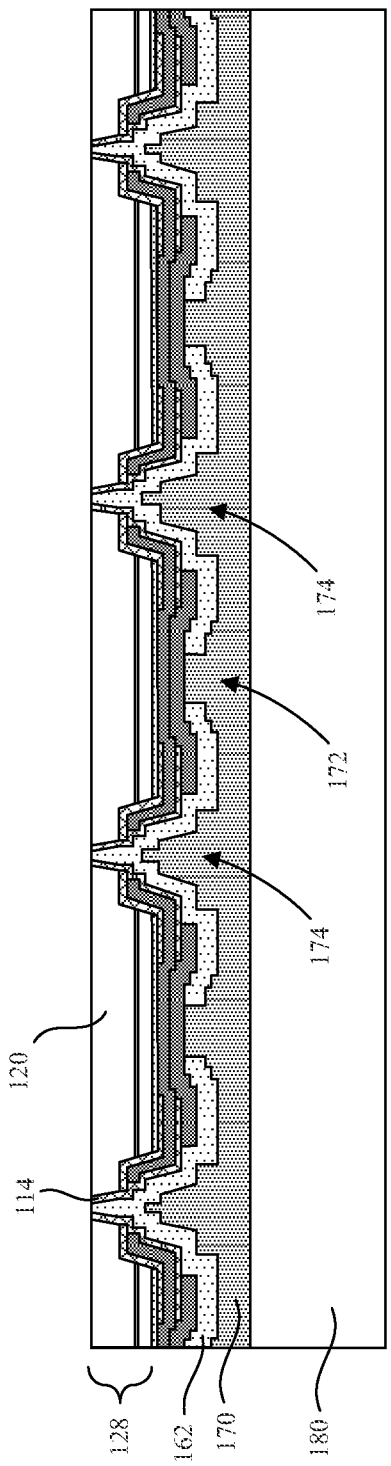
FIG. 14 is a cross-sectional side view illustration of a thinned down p-n diode layer in accordance with an embodiment.

FIG. 13 is a cross-sectional side view illustration of the removal of growth substrate 160 in accordance with an embodiment. When growth substrate 160 is sapphire, laser lift off (LLO) may be used to remove the sapphire. Removal may be accomplished by other techniques such as grinding and etching, depending upon the material selection of the growth substrate 160. Following the removal of the growth substrate 160, the p-n diode layer 128 may be thinned (e.g. n-doped layer 122) to expose the sacrificial release layer 162 as illustrated in FIG. 14. Thinning may be accomplished using one or more of chemical-mechanical-polishing (CMP), dry polishing, or dry etch. FIG. 14 illustrates that the previously connected portions of the p-n diode layer 128 are now removed, which leaves laterally separated p-n diodes 120. In an embodiment, an exposed top surface of each of the laterally separate p-n diodes 120 is co-planar with an exposed top surface of the second passivation layer 114 and sacrificial release layer 162.

Figure 15:
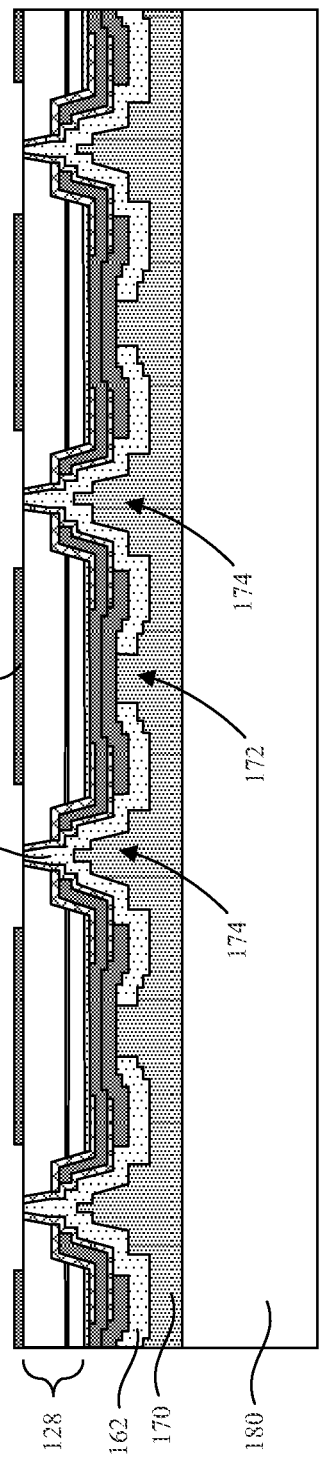
FIG. 15 is a cross-sectional side view illustration of an array of top conductive contacts formed over an array of p-n diodes in accordance with an embodiment.

Referring now to FIG. 15, an array of top conductive contacts 182 may optionally be formed over the array of p-n diodes 120. Conductive contacts 182 may be formed using a suitable technique such as electron beam physical deposition. In an embodiment, conductive contacts 182 include a thin metal layer or layer stack. Conductive contacts 182 may also be a conductive oxide such as indium-tin-oxide (ITO), or a combination of one or more metal layers and a conductive oxide. In an embodiment, the conductive contacts 182 are annealed to generate an ohmic contact with the array of p-n diodes 120. Where conductive contacts are metal, the thickness may be thin for transparency and reflectivity reasons. In an embodiment where conductive contacts are formed of a transparent material such as ITO, the conductive contacts may be thicker, such as 1,000 to 2,000 angstroms.

FIG. 16 is a cross-sectional side view illustration of an array of LEDs 150 formed on array of stabilization posts 172 after removal of sacrificial release layer 162 in accordance with an embodiment. In the embodiments illustrated, sacrificial layer 162 is removed resulting in an open space between each LED and the stabilization layer 170. As illustrated, there is an open space below each LED 150 as well as open space between each LED 150 and stabilization cavity sidewalls 174 of stabilization layer 170. A suitable etching chemistry such as HF vapor, $CF_4$, or $SF_6$ plasma may be used to etch the $SiO_2$ or $SiN_x$ of sacrificial release layer 162. In an embodiment the etching chemistry is HF vapor, and the sacrificial release layer 162 is selectively removed relative to the LEDs 150 and stabilization layer 170, without substantial degradation of the side minor or passivation.

In the embodiment illustrated in FIG. 16 the second passivation layer 114 may function to protect the reflective metallization layer 130 from chemical attack during sacrificial release layer 162 etching. In the embodiment illustrated in FIG. 17, a second passivation layer 114 and separate metallization layer 142 have not been formed. In either configuration, the barrier layer 138 (see FIGS. 3A-3B) formed of a suitable material such as Pt, may function to protect the underlying layers in the reflective metallization layer 130 (e.g. protect the minor layer 134) during etching of the sacrificial release layer 162.

Figure 20:
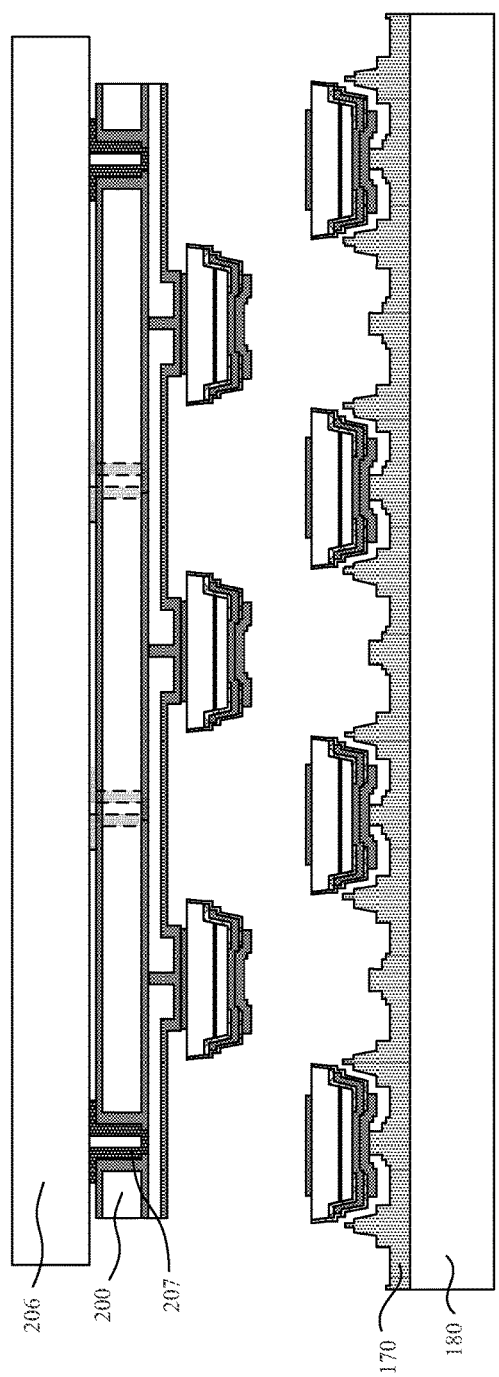
Figure 21:
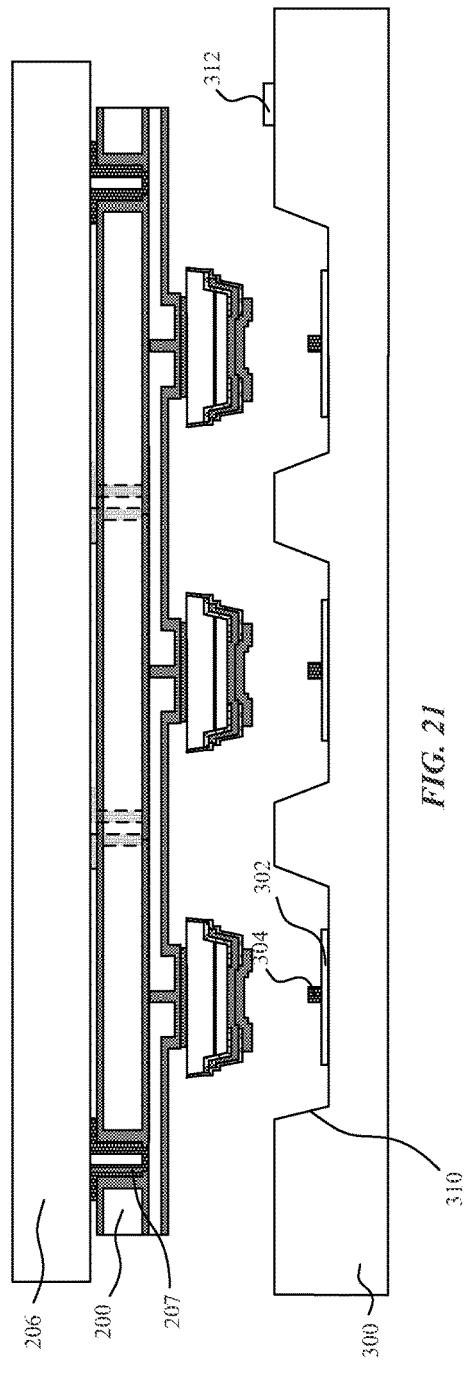
Figure 22:
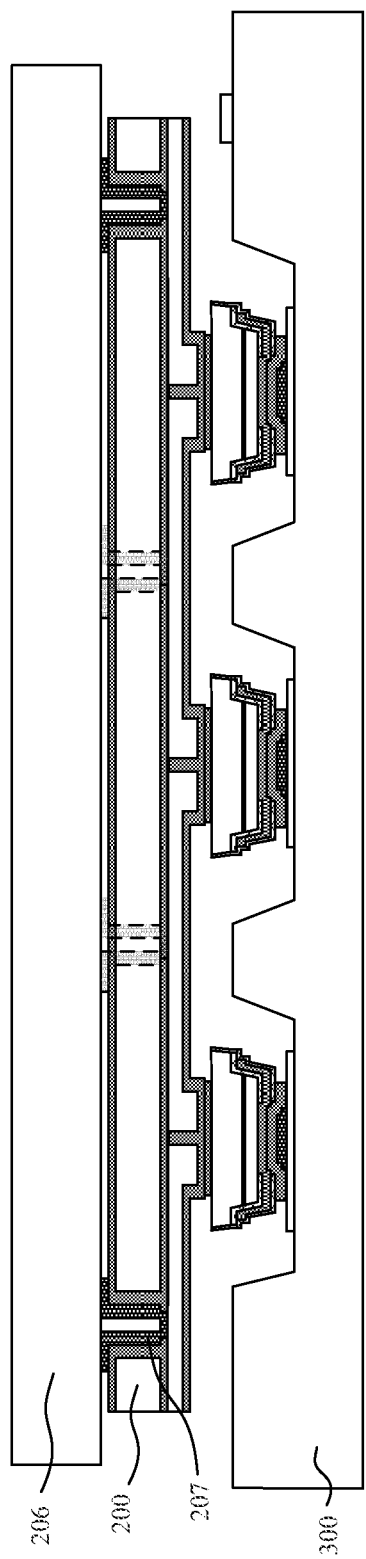

After sacrificial release layer 162 is removed, the array of LEDs 150 supported only by the array of stabilization posts 172 is poised for pick up and transfer to a receiving substrate. FIGS. 18-23 are cross-sectional side view illustrations for a method of transferring an array of micro LEDs from a carrier substrate to a receiving substrate in accordance with embodiments. FIG. 18 is a cross-sectional side view illustration of an array of transfer heads 204 supported by substrate 200 and positioned over an array of micro LEDs 150 in accordance with an embodiment. The array of micro LEDs 150 are then contacted with the array of transfer heads 204 as illustrated in FIG. 19. As illustrated, the pitch of the array of transfer heads 204 is an integer multiple of the pitch of the array of micro LEDs 150. A voltage is applied to the array of transfer heads 204. The voltage may be applied from the working circuitry within a transfer head assembly 206 in electrical connection with the array of transfer heads through vias 207. The array of micro LEDs 150 is then picked up with the array of transfer heads 204 as illustrated in FIG. 20. The array of micro LEDs 150 is then positioned over a receiving substrate 300 as illustrated in FIG. 21. In an embodiment the receiving substrate 300 is a display substrate. For example, the receiving substrate 300 may include an array of driver contacts 302, and optionally an array of bank structures 310 within subpixel areas. A solder material pillar 304 may be formed on each driver contact 302 for bonding with an LED 150. Referring now to FIG. 22, the array of LEDs 150 are brought into contact with contact pads on receiving substrate 300 including the solder material pillars 304. In one embodiment, an operation is performed to diffuse the solder material pillars 304 into the bonding layers 140 of each LED. For example, an indium, bismuth, or tin solder material pillar 304 may be diffused with a silver or gold bonding layer 140, though other materials may be used. For example, heat can be applied from a heat source located within the transfer head assembly 206 and/or receiving substrate 300. Where solder material pillars 304 are formed of a lower melting temperature material than the bonding layer 140, the solder material pillars 304 may reflow. The heating operation may result in the formation of an alloy material, or intermetallic compound with a melting temperature higher than the heating temperature. In an embodiment, sufficient diffusion to adhere the array of LEDs 150 with the array of contact pads 302 can be achieved at temperatures of less than 200° C.

Figure 23:
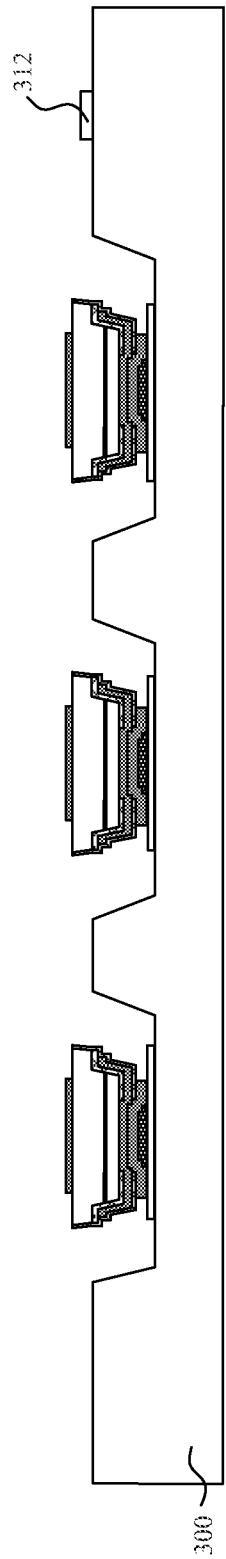

The array of LEDs 150 is then released onto receiving substrate 300 as illustrated in FIG. 23. Releasing the array of LEDs from the transfer heads 204 may be further accomplished with a variety of methods including turning off the voltage sources, lowering the voltage across the pair of transfer head electrodes, changing a waveform of the AC voltage, and grounding the voltage sources.

Figure 24:
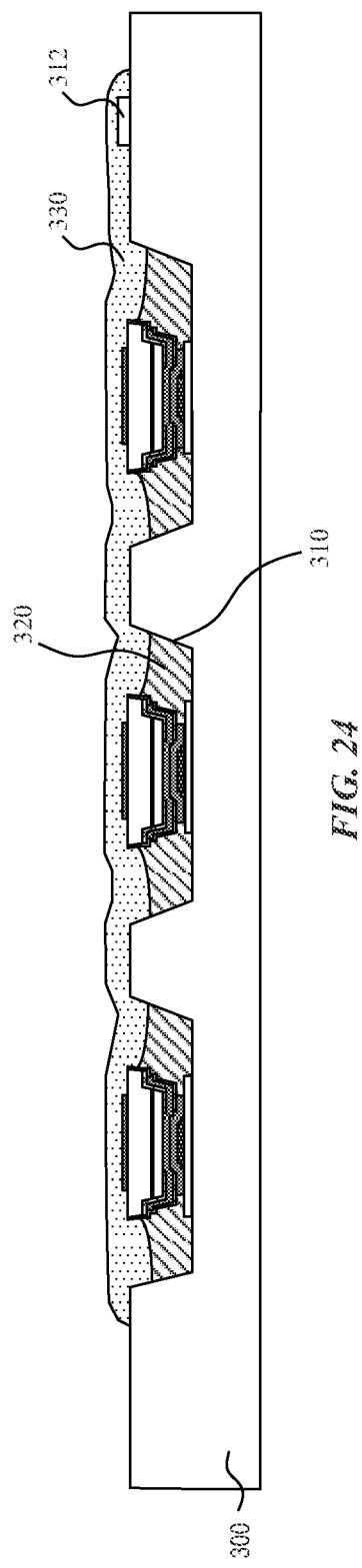
FIG. 24 is a cross-sectional side view illustration of an insulating layer formed around the array of LEDS and a top electrode layer formed over the array of LEDs in accordance with an embodiment.

Referring now to FIG. 24, after transferring the array of LEDs to the receiving substrate 300, the LEDs 150 may be further secured within the bank structures 310 with a insulating layer 320. The insulating layer 320 may function to secure the LEDs 150 on the receiving substrate 300. The insulating layer 320 may function to provide step coverage for a top electrode layer 330. In such a configuration, the insulating layer 320 aids in forming a continuous top electrode layer 330, providing step coverage at the sidewalls of the LEDs 150. In the embodiment illustrated, a plurality of laterally separate portions of the insulating layer 320 pool around the LEDs within the bank structures 310. In an embodiment, one or more top electrode layers 330 may be used to provide an electrical connection from the top of each vertical LED 150 to a Vss or ground line 312. For example, the top electrode layer 330 may be formed on the p-n diode 120 or top conductive contact 182 for a vertical LED 150.

Still referring to FIG. 24, the insulating layer 320 may prevent electrical shorting between the top electrode layer 330 and the driver contacts 302. In an embodiment in which the LEDs include a second passivation layer 114, the second passivation layer 114 may provide additional protection from the top electrode layer 330 making electrical contact with the reflective metallization layer 142. Thus, the second passivation layer 114 may provide a degree of manufacturing tolerance to the precise location and height of the insulating layer 320 relative to the LED 150 height. The insulating layer 320 may also cover any portions of the driver contacts 302 in order to prevent possible shorting. The insulating layer 320 may be transparent or semi-transparent to the visible wavelength, or opaque. Insulating layer may be formed of a variety of materials such as, but not limited to epoxy, acrylic (polyacrylate) such as poly(methyl methacrylate) (PMMA), benzocyclobutene (BCB), polyimide, and polyester. In an embodiment, insulating layer 320 is formed by ink jet printing or screen printing around the LEDs 150.

In an embodiment, the top electrode layer or layers 330 are transparent, or semi-transparent to the visible wavelength. For example, in top emission systems the top electrode layer 330 may be transparent, and for bottom emission systems the top electrode layer may be reflective. Exemplary transparent conductive materials include amorphous silicon, transparent conductive oxides (TCO) such as indium-tin-oxide (ITO) and indium-zinc-oxide (IZO), carbon nanotube film, or a transparent conductive polymer such as poly(3,4-ethylenedioxythiophene) (PEDOT), polyaniline, polyacetylene, polypyrrole, and polythiophene. In an embodiment, the top electrode layer 330 includes nanoparticles such as silver, gold, aluminum, molybdenum, titanium, tungsten, ITO, and IZO. In a particular embodiment, the top electrode layer 330 is formed by ink jet printing or screen printing ITO or a transparent conductive polymer such as PEDOT. Other methods of formation may include chemical vapor deposition (CVD), physical vapor deposition (PVD), spin coating.

Figure 25:
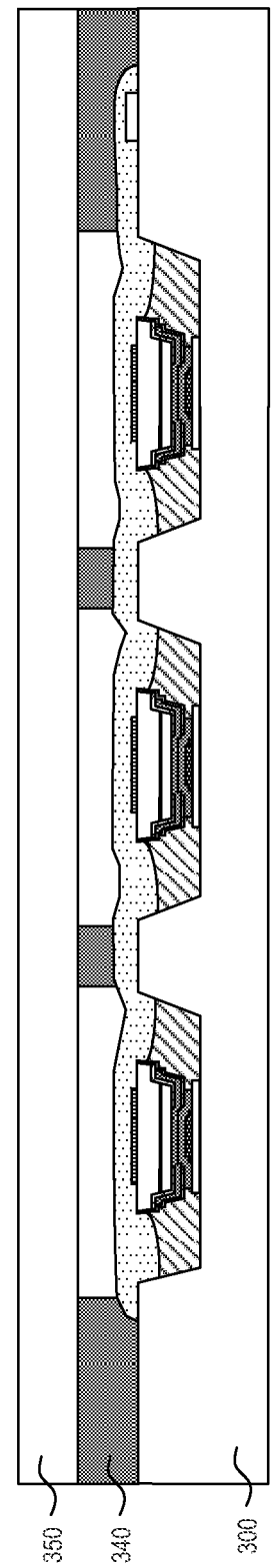
FIG. 25 is a cross-sectional side view illustration of a black matrix layer and protective cover plate formed over the array of LEDs in accordance with an embodiment.

FIG. 25 is a cross-sectional side view illustration of an embodiment in which a black matrix layer 340 is formed around an LED and underneath the protective cover plate 350 in order to block light emission, and to separate light emission from adjacent LEDs 150. In such an embodiment, the structure illustrated in FIG. 25 can emit light through the protective cover plate 350. Black matrix 340 can be formed from a method that is appropriate based upon the material used. For example, black matrix 340 can be applied using ink jet printing, sputter and etching, spin coating with lift-off, or a printing method. Exemplary black matrix materials include carbon, metal films (e.g. nickel, aluminum, molybdenum, and alloys thereof), metal oxide films (e.g. chromium oxide), and metal nitride films (e.g. chromium nitride), organic resins, glass pastes, and resins or pastes including a black pigment or silver particles. In an embodiment, insulating layer 320 is formed of a black matrix material. For example, a black pigment or particles can be included in the previously described insulating layer 320 materials. In an embodiment, a separate black matrix layer 340 may not be applied where insulating layer 320 is formed of a black matrix material.

While the protective cover plate 350 is illustrated as a rigid layer, the protective cover plate 350 may also be conformal to the underlying structure. As illustrated, rigid protective cover plate 350, for example, can be attached to the underlying structure with an adhesive such as a frit glass seal or epoxy formed along the edge of the cover with a dispenser or screen printing. In an embodiment, protective cover plate 350 is transparent glass or plastic. The protective cover plate 350 may be exposed to ambient atmosphere.

Figure 26:
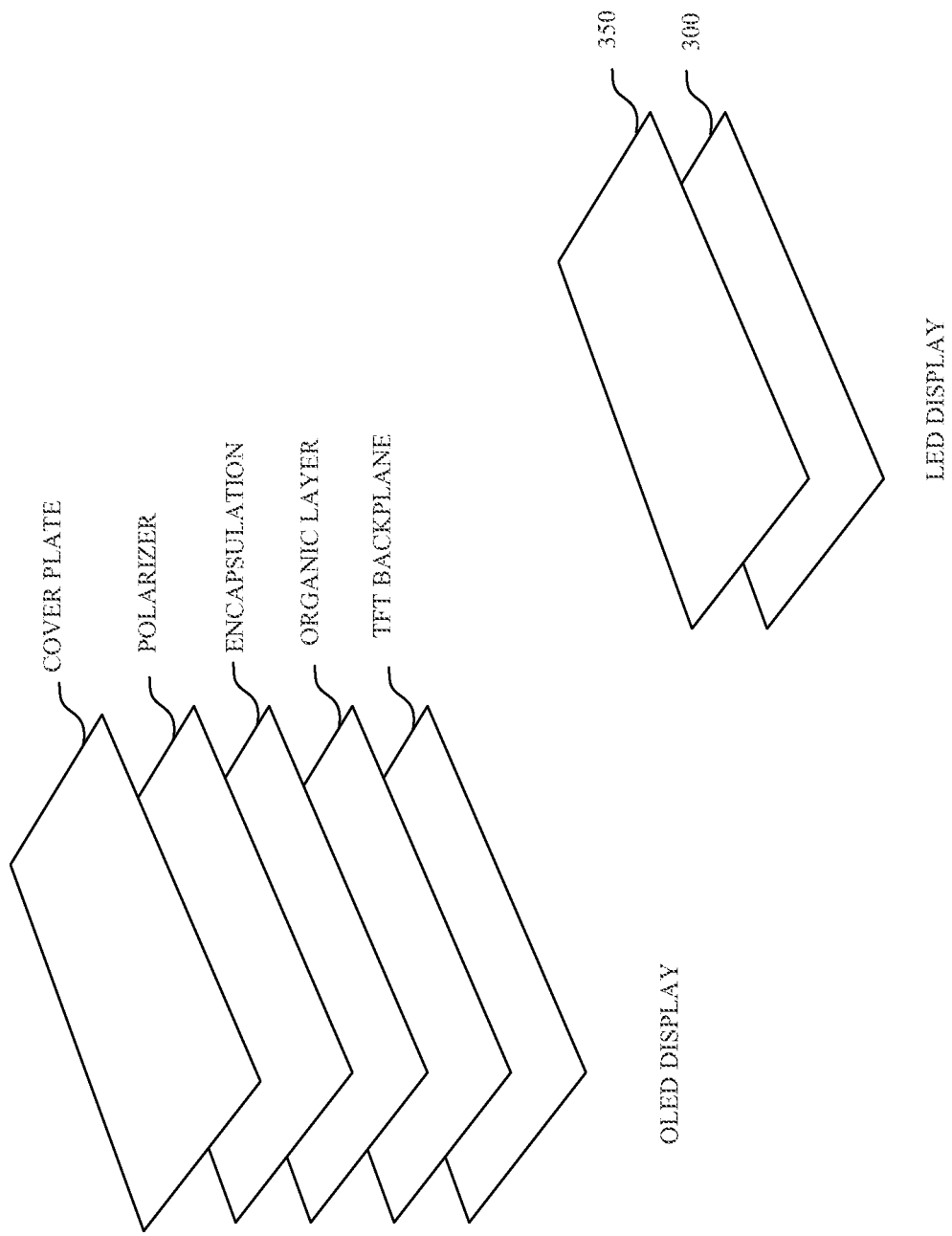
FIG. 26 is a schematic illustration of an emissive LED display that does not include a polarizer film between a display substrate and cover plate in accordance with an embodiment.

In accordance with embodiments an emissive LED structure is described with an integrated side minor. Further minimization of reflective layers around the LEDs may potentially eliminate the need for the location of a polarizer above the emissive LEDs and below the protective cover plate. For example, a conventional OLED display configuration is illustrated in FIG. 26 alongside an emissive LED display in accordance with an embodiment. As shown a conventional OLED display includes a thin film transistor (TFT) backplane substrate over which organic layers are formed. An encapsulation layer is formed over the organic layers, and a polarizer film is located above the encapsulation layer and below the protective cover plate. The polarizer film may significantly reduce brightness of the OLED display. An LED display stack in accordance with an embodiment does not include a polarizer film between the protective cover plate 350 and the display substrate 300.

Figure 27:
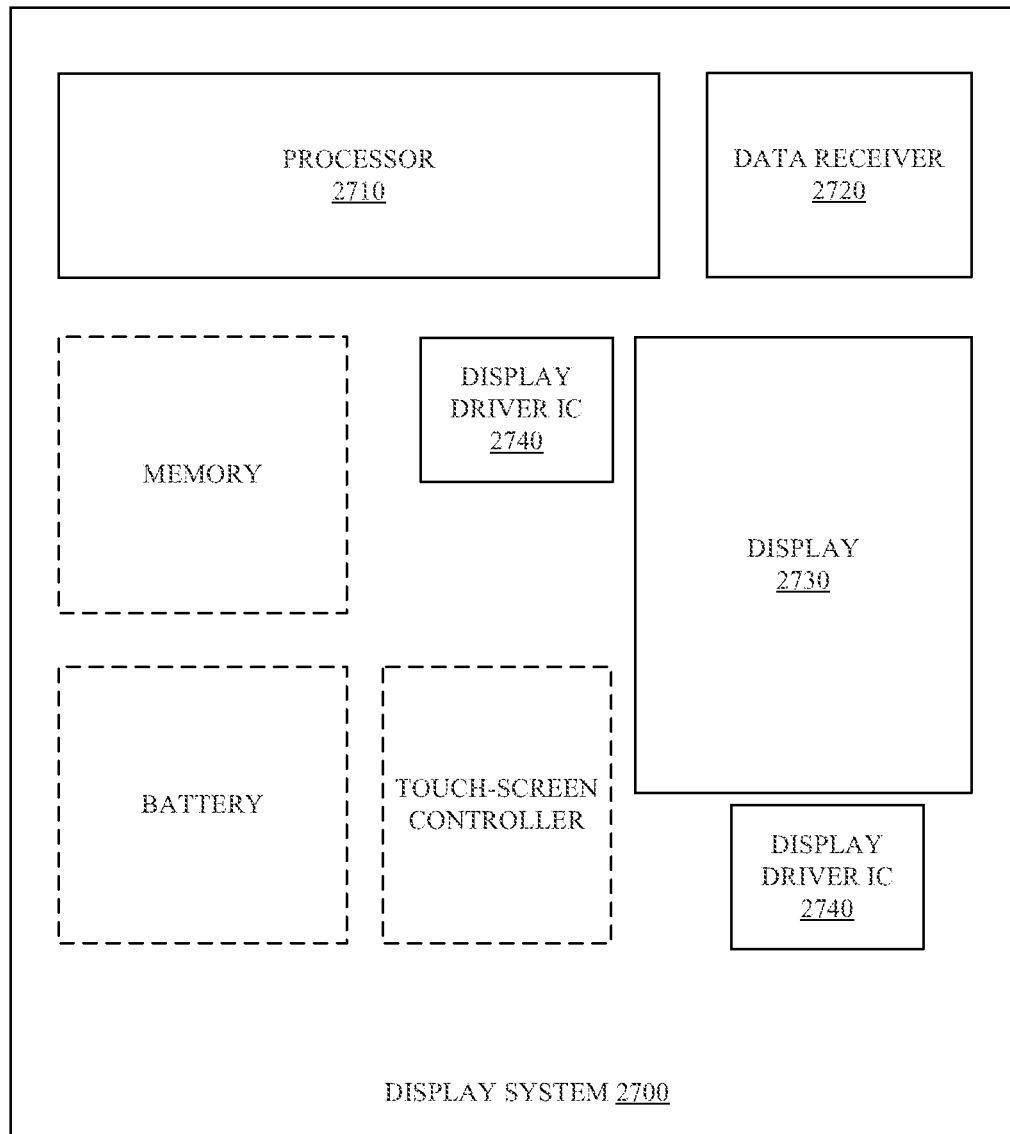
FIG. 27 is a schematic illustration of a display system in accordance with an embodiment.

FIG. 27 illustrates a display system 2700 in accordance with an embodiment. The display system houses a processor 2710, data receiver 2720, a display 2730, and one or more display driver ICs 2740, which may be scan driver ICs and data driver ICs. The data receiver 2720 may be configured to receive data wirelessly or wired. Wireless may be implemented in any of a number of wireless standards or protocols. The one or more display driver ICs 2740 may be physically and electrically coupled to the display 2730.

In some embodiments, the display 2730 includes one or more LEDs 150 that are formed in accordance with embodiments described above. Depending on its applications, the display system 2300 may include other components. These other components include, but are not limited to, memory, a touch-screen controller, and a battery. In various implementations, the display system 2700 may be a television, tablet, phone, laptop, computer monitor, kiosk, digital camera, handheld game console, media display, ebook display, or large area signage display.

In utilizing the various aspects of the embodiments, it would become apparent to one skilled in the art that combinations or variations of the above embodiments are possible for forming and integrating LEDs with integrated side minors onto a display or lighting backplane. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:
1. An LED comprising:
   a p-n diode including:
     a first layer doped with a first dopant type;
     a second layer doped with a second dopant type opposite the first dopant type; and
     a quantum well layer between the first layer and the second layer;
     wherein the p-n diode further includes a mesa structure protruding from a base structure, the base structure includes a top surface and a step surface opposite the top surface, and the mesa structure protrudes from the step surface, the first layer and quantum well layer are completely contained in the mesa structure, and the second layer is at least partially contained in the base structure;
   a passivation layer that spans sidewalls of the mesa structure, spans the step surface of the base structure, and does not span along sidewalls of the base structure, and includes an opening on a bottom surface of the mesa structure;
a reflective metallization layer on the passivation layer and within the opening in the passivation layer on the bottom surface of the mesa structure, wherein the reflective metallization layer laterally surrounds the mesa structure; and
a second passivation layer on the reflective metallization layer.

2. The LED of claim 1, wherein the second layer is partially contained in the mesa structure.

3. The LED structure of claim 2, further comprising a conductive oxide layer on the bottom surface of the mesa structure, wherein the conductive oxide layer is between the mesa structure and the reflective metallization layer.

4. The LED of claim 1, further comprising a top conductive contact formed on the top surface of the base structure.

5. The LED structure of claim 4, wherein the reflective metallization layer includes a mirror layer, a barrier layer formed on the mirror layer, and an outer-most bonding layer.

6. The LED structure of claim 1, wherein the second passivation layer spans along the sidewalls of the base structure.

7. The LED structure of claim 6, further comprising a second opening in the second passivation layer on the bottom surface of the mesa structure.

8. The LED structure of claim 7, further comprising a second metallization layer on the reflective metallization layer and within the second opening of the second passivation layer.

9. The LED structure of claim 8, wherein the reflective metallization layer comprises a layer stack, and the second metallization layer comprises a bonding layer.

10. The LED structure of claim 9, wherein the reflective metallization stack includes a mirror layer, and a barrier layer formed on the mirror layer.

11. The LED structure of claim 10, wherein the bonding layer comprises a noble metal.

12. A display system comprising:
a display substrate;
a plurality of LEDs bonded to a corresponding plurality of driver contacts in a display region of the display substrate;
wherein each LED comprises:
a p-n diode including:
a first layer doped with a first dopant type;
a second layer doped with a second dopant type opposite the first dopant type; and
a quantum well layer between the first layer and the second layer;
wherein the p-n diode further includes a mesa structure protruding from a base structure, the base structure includes a top surface and a step surface opposite the top surface, and the mesa structure protrudes from the step surface, the first layer and quantum well layers are completely contained in the mesa structure, and the second layer is at least partially contained in the base structure;
a passivation layer that spans sidewalls of the mesa structure, spans the step surface of the base structure, and does not span along sidewalls of the base structure, and includes an opening on a bottom surface of the mesa structure;
a reflective metallization layer on the passivation layer and within the opening in the passivation layer on the bottom surface of the mesa structure, wherein the reflective metallization layer laterally surrounds the mesa structure;
a second passivation layer on the reflective metallization layer, and spanning sidewalls of the base structure;
a second opening in the second passivation layer on the bottom surface of the mesa structure; and
a second metallization layer on the reflective metallization layer and within the second opening of the second passivation layer.

13. The display system of claim 12, wherein the display system is selected from the group consisting of a television, tablet, phone, laptop, computer monitor, kiosk, digital camera, handheld game console, media display, ebook display, and large area signage display.

14. A display system comprising:
a display substrate;
a plurality of LEDs bonded to a corresponding plurality of driver contacts in a display region of the display substrate;
wherein each LED comprises:
a p-n diode including:
a first layer doped with a first dopant type;
a second layer doped with a second dopant type opposite the first dopant type; and
a quantum well layer between the first layer and the second layer;
wherein the p-n diode further includes a mesa structure protruding from a base structure, the first layer and quantum well layers are completely contained in the mesa structure, and the second layer is at least partially contained in the base structure;
a passivation layer that spans sidewalls of the mesa structure and includes an opening on a bottom surface of the mesa structure;
a reflective metallization layer on the passivation layer and within the opening in the passivation layer on the bottom surface of the mesa structure, wherein the reflective metallization layer laterally surrounds the mesa structure; and
a transparent protective cover plate secured over the display region of the display substrate, wherein a polarizer film is not located between the transparent protective cover plate and the display substrate, and the transparent protective cover plate is exposed to ambient atmosphere.

* * * * *